United States Patent
Lu et al.

(10) Patent No.: US 11,081,776 B2
(45) Date of Patent: Aug. 3, 2021

(54) ELECTRONIC PACKAGE

(71) Applicant: Siliconware Precision Industries Co., Ltd., Taichung (TW)

(72) Inventors: Ying-Wei Lu, Taichung (TW); Bo-Siang Fang, Taichung (TW); Kuan-Ta Chen, Taichung (TW); Chia-Chu Lai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 70 days.

(21) Appl. No.: 16/554,952

(22) Filed: Aug. 29, 2019

(65) Prior Publication Data
US 2021/0013583 A1 Jan. 14, 2021

(30) Foreign Application Priority Data
Jul. 11, 2019 (TW) .................... 108124508

(51) Int. Cl.
*H01Q 1/22* (2006.01)
(52) U.S. Cl.
CPC .................... *H01Q 1/22* (2013.01)
(58) Field of Classification Search
CPC ......... H01Q 1/2283; H01Q 1/36; H01Q 1/38; H01Q 9/04; H01Q 9/0407; H01Q 9/0414; H01Q 19/005; H01Q 23/00; H01Q 5/378; H01Q 5/385; H01Q 5/392; H01L 2223/6677
See application file for complete search history.

(56) References Cited

U.S. PATENT DOCUMENTS

| | | | |
|---|---|---|---|
| 2016/0049723 A1* | 2/2016 | Baks | H01Q 1/2291 343/848 |
| 2017/0201023 A1* | 7/2017 | Chiu | H01Q 9/065 |
| 2017/0231095 A1* | 8/2017 | Chiu | G06K 19/07777 |
| 2018/0315715 A1* | 11/2018 | Chiu | H01L 23/66 |
| 2019/0280374 A1* | 9/2019 | Kim | H01L 23/66 |
| 2019/0319347 A1* | 10/2019 | Fang | H01L 23/552 |
| 2019/0326674 A1* | 10/2019 | Kang | H01L 24/13 |
| 2020/0052393 A1* | 2/2020 | Fang | H01Q 1/2283 |
| 2020/0093006 A1* | 3/2020 | Tseng | H01L 23/5383 |

* cited by examiner

*Primary Examiner* — Jason Crawford
(74) *Attorney, Agent, or Firm* — Mintz Levin Cohn Ferris Glovsky and Popeo, P.C.; Peter F. Corless; Steven M. Jensen

(57) ABSTRACT

An electronic package is provided. A functioning member having a concave portion and a second antenna portion is disposed on a carrier having a first antenna portion. The concave portion and the carrier form a functioning space. The first antenna portion and the second antenna portion are disposed in a projection space of the functioning space. The first antenna portion induces the second antenna portion.

12 Claims, 3 Drawing Sheets

ELECTRONIC PACKAGE

CROSS-REFERENCE TO RELATED APPLICATIONS

This application claims priority to Taiwanese Application Serial No. 108124508, filed on Jul. 11, 2019. The entirety of the application is hereby incorporated by reference herein and made a part of this specification.

BACKGROUND

1. Technical Field

The present disclosure relates to electronic packages, and, more particularly, to an electronic package having an antenna structure.

2. Description of the Prior Art

Wireless communication technique has been widely applied to a variety of consumer electronic products that can receive and transmit wireless signals. The consumer electronic products are developed to be compact-sized and low-profiled, and a patch antenna, due to its characteristics of small volume, light weight and easy to be manufactured, is widely used in a wireless communication module of an electronic produce, such as a cellular phone.

Modern wireless transmission has to have a bandwidth large enough to transmit a huge amount of data, and the fifth generation (5G) wireless transmission comes to the market accordingly. The 5G wireless transmission has a higher frequency transmission and highly demands on the size of the wireless communication module.

FIG. 1 is a schematic diagram of a wireless communication module 1 according to the prior art. The wireless communication module 1 comprises a substrate 10, a plurality of electronic components 11 disposed on and electrically connected to the substrate 10, an antenna structure 12, and a packaging material 13. The substrate 10 is a rectangular circuit board. The antenna structure 12 is planar and has a conductive wire 121 and an antenna body 120 electrically connected via the conductive wire 121 to the electronic components 11. The packaging material 13 packages the electronic components 11 and a portion of the conductive wire 121.

Since a 5G system highly demands signal quality and transmission speed, more antennas have to be installed therein. However, in the wireless communication module 1, the antenna structure 12 is planar and the substrate has limited length and width, the functions of the antenna structure 12 are thus limited, and the wireless communication module 1 cannot meet the requirement of antenna operation for the 5G system.

Further, since the antenna structure 12 is planar, an additional layout area has to be formed on a surface of the substrate 10 (where the packaging material 13 is not formed), to form the antenna body 120. As such, the substrate 10 cannot have its width reduced. Accordingly, the width of the wireless communication module 1 cannot be reduced, and the wireless communication module 1 cannot meet the miniaturization requirement.

Therefore, how to overcome the problems of the prior art is becoming an urgent issue in the art.

SUMMARY

In view of the drawbacks of the prior art, the present disclosure provides an electronic package, comprising: a carrier provided with a circuit portion and a first antenna portion electrically connected to the circuit portion; and a functioning member mounted on the carrier and provided with a concave portion and a second antenna portion, wherein the concave portion and the carrier form a functioning space, the first antenna portion and the second antenna portion are disposed in a projection space of the functioning space, and the first antenna portion induces the second antenna portion.

In an embodiment, the functioning member is integrated with the concave portion.

In an embodiment, the functioning member is bonded via a bonding layer to the carrier.

In an embodiment, the functioning member comprises an insulation material or a semiconductor material. In another embodiment, the insulation material is a ceramic material. In yet another embodiment, the semiconductor material is a silicon material.

In an embodiment, the functioning member defines a first block and a second block, the second antenna portion is disposed on the first block, the concave portion is disposed on the second block, and the second block is bonded to the carrier. In another embodiment, the second block is thicker than the first block.

In an embodiment, the second antenna portion is free from being electrically connected to the circuit portion.

In an embodiment, the functioning member is free from being electrically connected to the carrier.

In an embodiment, the functioning space is an air chamber.

In an embodiment, the first antenna portion is disposed inside the functioning space, and the second antenna portion is disposed outside the functioning space.

In an embodiment, the electronic package further comprises an electronic component disposed on the carrier.

In the electronic package according to the present disclosure, the functioning member has the concave portion. Therefore, under the requirement that the functioning member has a constant overall thickness, the thickness of the first block of the functioning member can meet the thinning requirement, and the thickness of the second block of the functioning member or the depth of the concave portion can be maximized. As a result, the functioning space required for transmitting antenna signals needs to be higher. Therefore, the electronic package according to the present disclosure reduces the equivalent dielectric coefficient, improves the antenna performance, and meets the requirement for antenna operation in a 5G system.

Since low temperature co-fired ceramic (LTCC) constituting the functioning member requires a simple manufacture process and the ceramic material is hard, the feasibility of the manufacturing process and the yield of the product structure are improved. Further, the concave portion of the functioning member can reduce the equivalent dielectric coefficient and strengthen the antenna performance.

Since the functioning member is provided with the second antenna portion, no additional layout area is required on the carrier. Compared with the prior art, the present disclosure can plan the length of the second antenna portion on the functioning member when the carrier has a constant size. Therefore, the present disclosure can meet the requirement for antenna operation, and the electronic package can meet the miniaturization requirement.

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "first," "second," "a" and the like, are used to distinguish one element from another, and are not intended to limit the scope of the present application. Changes or adjustments are considered to be within the scope of the present disclosure, without departing from the scope of the present disclosure.

Figure 1:
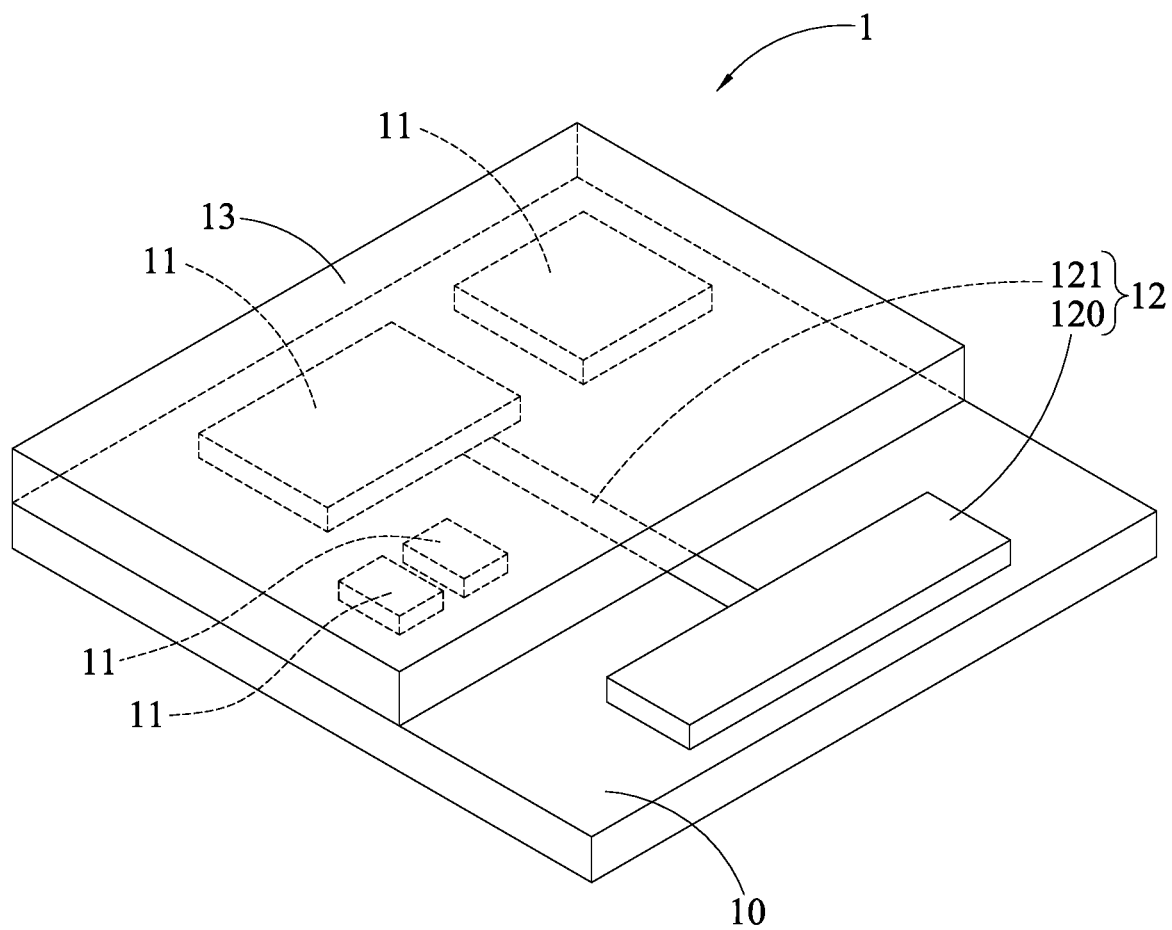
FIG. 1 is a cross-sectional view of a wireless communication module according to the prior art.
Figure 2:
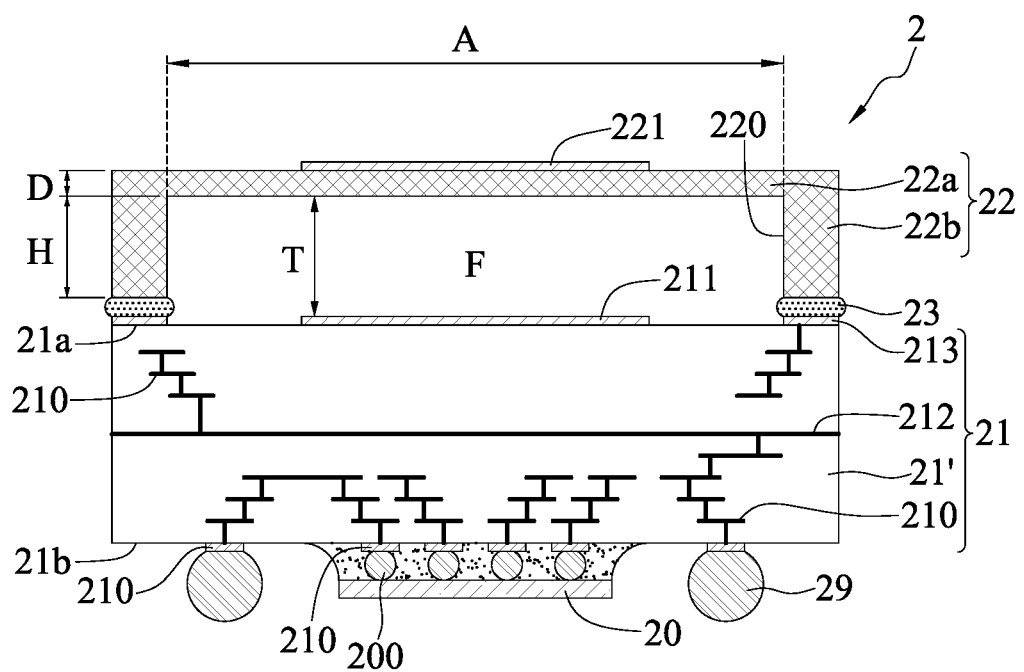
FIG. 2 is a cross-sectional view of an electronic package according to the present disclosure.

FIG. 2 is a cross-sectional view of an electronic package 2 according to the present disclosure. The electronic package 2 comprises a carrier 21, a functioning member 22, and at least one electronic component 20 disposed on the carrier 21.

The carrier 21 is a circuit structure having a core layer or a coreless circuit structure, such as a substrate. The carrier 21 is defined with a first side 21a and a second side 21b opposing the first side 21a, and comprises an insulation portion 21', a circuit portion 210 bonded to the insulation portion 21', and a first antenna portion 211 disposed on the first side 21a and electrically connected to the circuit portion 210.

In an embodiment, a fan out circuit portion 210 can be formed in a redistribution layer (RDL) manner, and is made of copper. The insulation portion 21' is made of Polybenzoxazole (PBO), Polyimide (PI), Prepreg (PP) or other dielectric materials. The use of a circuit structure having a core layer and multiple dielectric layers can increase the structural thickness of the circuit portion 210 and the insulation portion 21', and strengthen the performance of the first antenna portion 211, such as antenna gain, bandwidth, radiation efficiency etc., and a simple manufacturing process is used.

The first antenna portion 211 is a circuit-type antenna or a metal leaf antenna. In an embodiment, the circuit portion 210 and the first antenna portion 211 are fabricated together in the RDL manner.

The carrier 21 further has a ground layer 212 disposed in the insulation portion 21' and electrically connected to the first antenna portion 211. In an embodiment, the circuit portion 210 and the ground layer 212 are fabricated together in the RDL manner.

A plurality of solder balls 29 are disposed on the circuit portion 210 of the second side 21b of the carrier 21, and an electronic structure, such as a circuit board or another wiring board, can be mounted on the solder balls 29.

Figure 3:
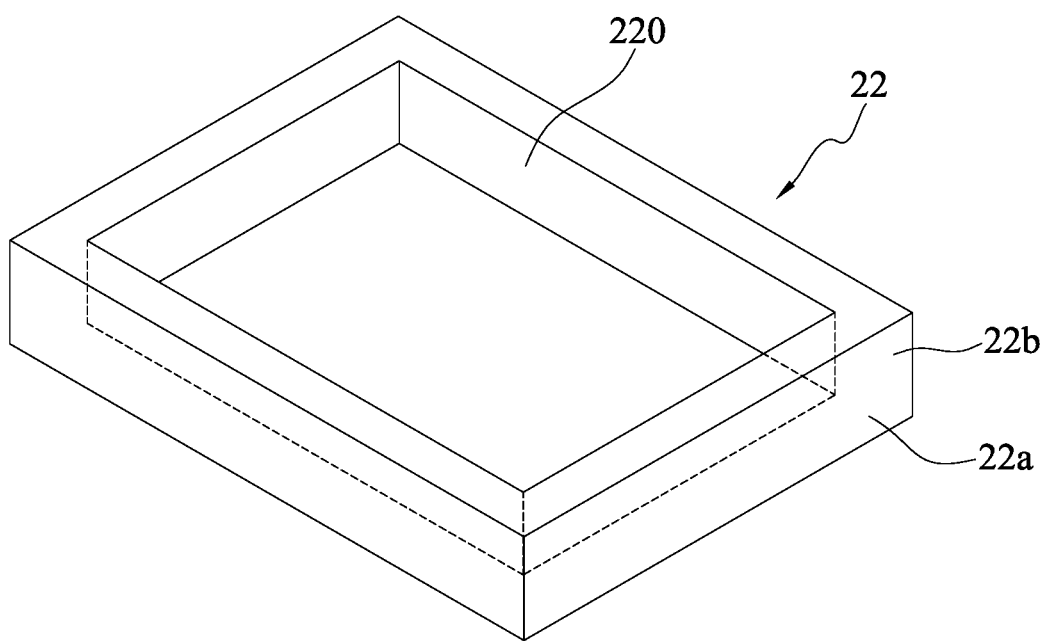
FIG. 3 is a schematic diagram of a functioning member of the electronic package according to the present disclosure.

The functioning member 22 is disposed on the first side 21a of the carrier 21, and is a board body or a frame structure. As shown in FIG. 3, a first block 22a and a second block 22b integrated with each other are defined in the upper and lower directions, respectively, a second antenna portion 221 is disposed on the first block 22a, and a concave portion 220 is disposed on the second block 22b.

In an embodiment, the second block 22b of the functioning member 22 is bonded to the first side 21a of the carrier 21, an area confined by a surface of the first side 21a of the carrier 21 and the concave portion 220 of the functioning member 22 forms a functioning space F, and the first antenna portion 211 and the second antenna portion 221 are disposed within a projection range A of the functioning space F. The first antenna portion 211 is disposed inside the functioning space F, and the second antenna portion 221 is disposed outside the functioning space F. In an embodiment, the second block 22b of the functioning member 22 is bonded to a bonding pad 213 of the first side 21a of the carrier 21 via adhesive or other suitable materials. The bonding pad 213 is electrically connected to or is not electrically connected to the circuit portion 210. The bonding pad 213 is used for positioning the functioning member 22 when the functioning member 22 is mounted, and can be omitted on demand.

The second antenna portion 221 is a circuit-type antenna or a metal leaf antenna. The first antenna portion 211 senses the second antenna portion 221, and signals are transmitted therebetween. No spot glue, molding filler or other material is in the functioning space F, and the functioning space F is kept spacious and has an air chamber, to ensure the quality of the signals transmitted between the first antenna portion 211 and the second antenna portion 221. Besides the first antenna portion 211, no metal structure should be disposed around the functioning space F, to avoid interfering transmission of the antenna signals. Therefore, besides the second antenna portion 221, no other metal material (e.g., a circuit) will be disposed on the functioning member 22, and the bonding pad 213 can even be omitted.

The functioning member 22 is made of an insulation material or a semiconductor material, such as Low Temperature Co-fired Ceramics (LTCC) or a silicon material, and is provided with no conductive circuit, so that the functioning member 22 is not electrically connected to the carrier 21, and the second antenna portion 220 is not electrically connected to the circuit portion 210 of the carrier 21. Due to the manufacture characteristics of the LTCC, the functioning member 22 is formed to have a chamber (or having the concave portion 220), and is adhered to the carrier 21. Due to the hardness characteristics of a ceramic material, the feasibility of the manufacturing process is improved. In an embodiment, the thickness H of the second block 22b or the depth of the concave portion 220 is about 500 μm, and the thickness D of the first block 22a is about 100 μm.

The functioning member 22 is integrated with the concave portion 220, and the second block 22b acts as a supporting portion for bonding to the carrier 21. Therefore, no supporting element for the carrier 21 to be stacked thereon is required to be provided on the functioning member 22.

The electronic component 20 is disposed on the second side 22b of the carrier 21.

The electronic component 20 is an active element, such as a semiconductor chip, a passive element, such as a resistor, a capacitor and an inductor, or a combination thereof. In an embodiment, the electronic component 20 is electrically connected to the first circuit portion 210 in a flip-chip manner via a plurality of conductive bumps 200, such as a solder material. In another embodiment, the electronic component 20 is electrically connected to the first circuit portion 210 in a wire bonding manner via a plurality of bonding wires (not shown). In yet another embodiment, the electronic component 20 is in direct contact with and electrically connected to the first circuit portion 210. The electronic component 20 can also be electrically connected to the carrier 21 in other manners.

Although the electronic component 20 is not disposed between the carrier 21 and the functioning member 22, the electronic component 20 can be disposed in other manners (e.g., being disposed on the first side 21a of the carrier 21).

In the electronic package 2 according to the present disclosure, the functioning member 22 is provided with the concave portion 220. Therefore, even if under the requirement of the functioning member 22 having a constant overall thickness, the thickness of the solid dielectrics (e.g., the thickness D of the first block 22a of the functioning member 22) can still meet the thinning requirement, the height T of the air chamber or the functioning space F (which is approximately equal to the thickness H of the second block 22b of the functioning member 22 or the depth of the concave portion 220, and the thickness of the bonding layer 23 between the functioning member 22 and the carrier 21 is so thin that can be neglected) formed by the concave portion 220 and carrier 21 can still meet the maximization requirement, and more layout ratio of the air required when the antenna signals are transmitted can be obtained. Compared with the prior art, the electronic package 2 according to the present disclosure can reduce the equivalent dielectric coefficient effectively, strengthen the antenna performance, and meet the requirement of antenna operation of the 5G system.

Since LTCC constituting the functioning member requires a simple manufacture process and the ceramic material is hard, the feasibility of the manufacturing process and the yield of the product structure are improved. Further, the concave portion 220 of the functioning member 22 (or the functioning space F having the air chamber) can reduce the equivalent dielectric coefficient and strengthen the antenna performance.

Since the functioning member 22 is provided with the second antenna portion 221, no additional layout area is required to be formed on the carrier 21. Compared with the prior art, the present disclosure can plan the length of the second antenna portion 221 on the functioning member 22 when the carrier 21 has a constant size. Therefore, the present disclosure can meet the requirement of antenna operation, and the electronic package 2 can meet the miniaturization requirement.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
a carrier provided with a circuit portion and a first antenna portion electrically connected to the circuit portion; and
a functioning member mounted on the carrier and provided with a concave portion and a second antenna portion,
wherein the functioning member is defined with a first block and a second block, the second antenna portion is disposed on the first block, the concave portion is disposed on the second block, and the functioning member is bonded via the second block to the carrier, and
wherein the concave portion and the carrier form a functioning space, the first antenna portion and the second antenna portion are disposed in a projection space of the functioning space, and the first antenna portion induces the second antenna portion.

2. The electronic package of claim 1, wherein the functioning member is integrated with the concave portion.

3. The electronic package of claim 1, further comprising a bonding layer bonding the functioning member to the carrier.

4. The electronic package of claim 1, wherein the functioning member comprises an insulation material or a semiconductor material.

5. The electronic package of claim 4, wherein the insulation material is a ceramic material.

6. The electronic package of claim 4, wherein the semiconductor material is a silicon material.

7. The electronic package of claim 1, wherein the second block is thicker than the first block.

8. The electronic package of claim 1, wherein the second antenna portion is free from being electrically connected to the circuit portion.

9. The electronic package of claim 1, wherein the functioning member is free from being electrically connected to the carrier.

10. The electronic package of claim 1, wherein the functioning space is an air chamber.

11. The electronic package of claim 1, wherein the first antenna portion is disposed inside the functioning space, and the second antenna portion is disposed outside the functioning space.

12. The electronic package of claim 1, further comprising an electronic component disposed on the carrier.

* * * * *